(12) United States Patent
Lesso

(10) Patent No.: US 11,832,523 B2
(45) Date of Patent: Nov. 28, 2023

(54) DRIVER CIRCUITRY COMPRISING ACTIVE INDUCTOR CIRCUITRY FOR DRIVING PIEZOELECTRIC TRANSDUCERS

(71) Applicant: Cirrus Logic International Semiconductor Ltd., Edinburgh (GB)

(72) Inventor: John P. Lesso, Edinburgh (GB)

(73) Assignee: Cirrus Logic Inc., Austin, TX (US)

( * ) Notice: Subject to any disclaimer, the term of this patent is extended or adjusted under 35 U.S.C. 154(b) by 347 days.

(21) Appl. No.: 17/075,255

(22) Filed: Oct. 20, 2020

(65) Prior Publication Data

US 2022/0123196 A1   Apr. 21, 2022

(51) Int. Cl.
| H01L 41/04 | (2006.01) |
| H01L 41/107 | (2006.01) |
| H10N 30/80 | (2023.01) |
| H10N 30/40 | (2023.01) |

(52) U.S. Cl.
CPC ........... *H10N 30/804* (2023.02); *H10N 30/40* (2023.02)

(58) Field of Classification Search
CPC ..... H01L 41/044; H01L 41/107; H10N 30/40; H10N 30/804
USPC ........................................................ 310/317
See application file for complete search history.

(56) References Cited

U.S. PATENT DOCUMENTS

| 7,042,317 B2 | 5/2006 | Xiao et al. | |
| 11,451,209 B2* | 9/2022 | Gong | .................... H01L 41/332 |
| 2012/0081822 A1* | 4/2012 | Woo | .......................... H03J 3/08 |
| | | | 361/56 |

FOREIGN PATENT DOCUMENTS

DE   102009048779 A1   4/2011

OTHER PUBLICATIONS

International Search Report and Written Opinion of the International Searching Authority, International Application No. PCT/GB2021/052331, dated Dec. 23, 2021.
Edvina, Jan et al., "A fully integrated digitally controllable grounded inductor simulator with a large inductance range for damping of ultrasonic transducers", Analog Integrated Circuits and Signal Processing, Springer New York LLC, US, vol. 102, No. 1, Jan. 25, 2019, pp. 125-130.

* cited by examiner

*Primary Examiner* — Shawki S Ismail
*Assistant Examiner* — Monica Mata
(74) *Attorney, Agent, or Firm* — Jackson Walker L.L.P

(57) ABSTRACT

The present disclosure relates to circuitry for driving a piezoelectric transducer. The circuitry may be implemented as an integrated circuit and comprises driver circuitry configured to supply a drive signal to the piezoelectric transducer to cause the transducer to generate an output signal and active inductor circuitry configured to be coupled with the piezoelectric transducer. The active inductor circuitry may be tuneable to adjust a frequency characteristic of the output signal.

20 Claims, 10 Drawing Sheets

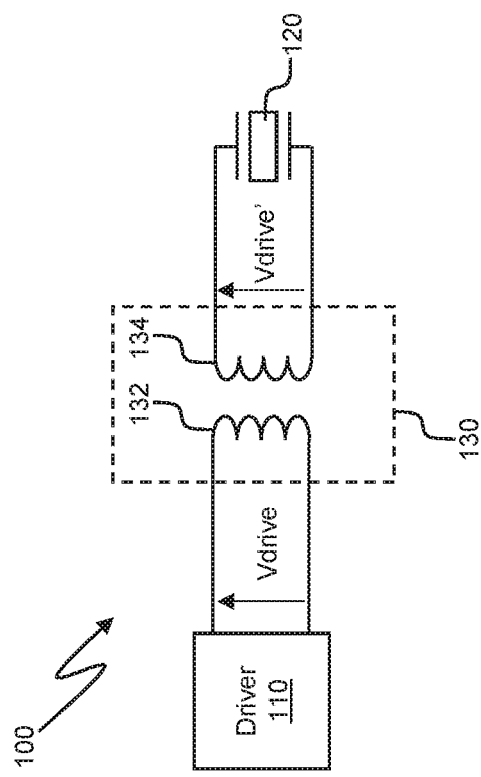

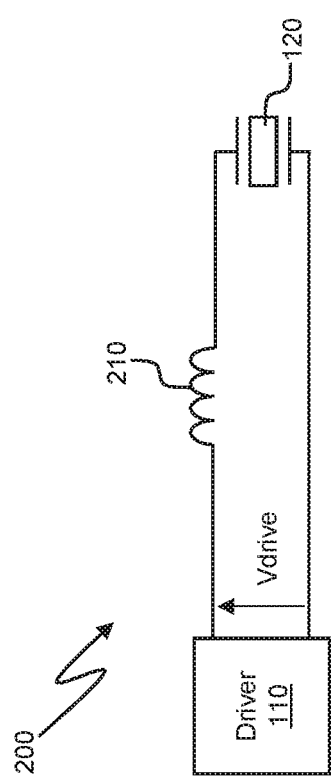

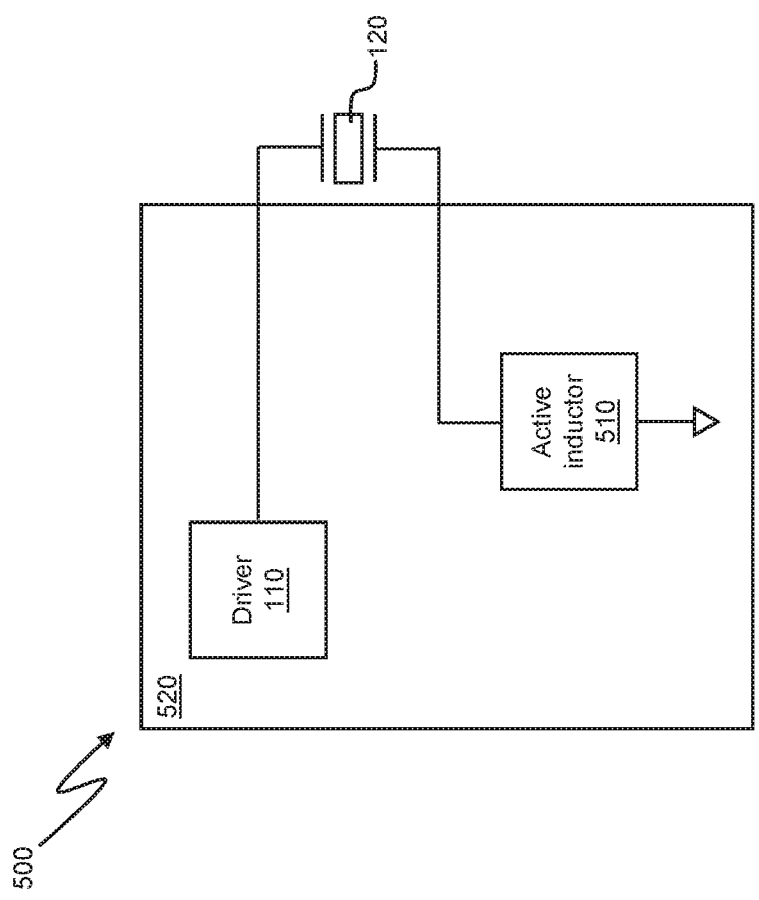

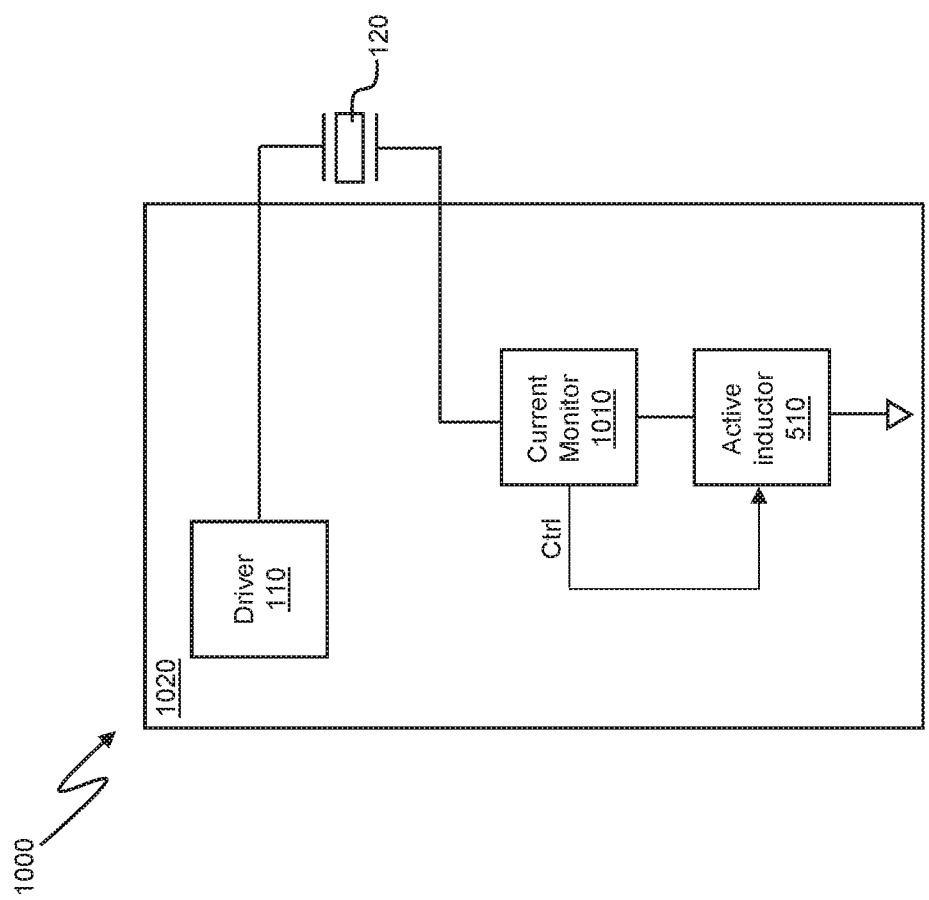

DRIVER CIRCUITRY COMPRISING ACTIVE INDUCTOR CIRCUITRY FOR DRIVING PIEZOELECTRIC TRANSDUCERS

FIELD OF THE INVENTION

The present disclosure relates to driver circuitry for piezoelectric transducers.

BACKGROUND

Piezoelectric transducers are used in a variety of applications. For example, parking sensor systems for cars and other vehicles typically employ a plurality of piezoelectric transducers for transmitting and detecting ultrasonic signals.

In such systems, an ultrasonic signal is transmitted by a piezoelectric element and the time taken for a reflection of the transmitted signal to be detected (usually by the same piezoelectric element) is measured. Based on this measured time, a distance to the object from which the ultrasonic signal was reflected can be calculated, and a signal (typically an audible signal) indicative of the distance to the object can be generated and output.

A common approach in such systems is to use a transformer to provide a driving voltage (i.e. the voltage across the piezoelectric element when transmitting an ultrasonic signal) of the order of, for example, 70-100V, in order to increase the signal to noise ratio of the transmitted signal. This has the effect of increasing the effective range of the system, since the energy of a transmitted ultrasound signal is increased, allowing the transmitted signal and any resulting reflected ultrasound signal to travel further.

This approach is illustrated in simplified form in FIG. 1, which shows a system 100 including driver circuitry 110, a piezoelectric element 120, and a transformer 130. A primary coil 132 of the transformer 130 is coupled to the driver circuitry 110 so as to receive a primary drive signal Vdrive output by the driver circuitry 110. A secondary coil 134 of the transformer 130, which has fewer turns than the primary coil 132, is coupled to the piezoelectric element 120, such that the piezoelectric element 120 receives a secondary drive signal Vdrive' whose amplitude is greater than that of the primary drive signal Vdrive. As will be appreciated by those of ordinary skill in the art, the increase in the amplitude of the secondary drive signal Vdrive' with respect to the primary drive signal Vdrive is governed by the turns ratio of the transformer (i.e. the ratio of turns of the primary coil 132 to turns of the secondary coil 134).

There are a number of disadvantages to the approach illustrated in FIG. 1. In particular, the transformer 130 is typically physically large, heavy and costly (compared to an integrated circuit that may be used to implement the driver circuitry 110). Further, the effective range of the system 100 is limited, and the system 100 is susceptible to interference from signals transmitted by other transducers.

SUMMARY

According to a first aspect, the invention provides circuitry for driving a piezoelectric transducer, the circuitry comprising: driver circuitry configured to supply a drive signal to the piezoelectric transducer to cause the transducer to generate an output signal; and active inductor circuitry configured to be coupled with the piezoelectric transducer, wherein the active inductor circuitry is tuneable to adjust a frequency characteristic of the output signal.

The active inductor circuitry may comprise gyrator circuitry and a capacitance.

The gyrator circuitry may comprise first and second transconductors arranged in a back-to-back configuration.

The capacitance may be adjustable.

Additionally or alternatively, a transconductance of at least one of the first and second transconductors may be adjustable.

The first and second transconductors may comprise operational transconductance amplifiers, each having a variable bias current or voltage.

The circuitry may further comprise current monitor circuitry configured to be coupled to the piezoelectric transducer, the current monitor circuitry comprising control circuitry configured to: estimate an impedance of the piezoelectric transducer; and output a control signal to the active inductor circuitry to cause the active inductor circuitry to adjust a parameter thereof so as to adjust an operational frequency characteristic of the piezoelectric transducer.

The active inductor circuitry may comprise first and second transconductors and a capacitance, and the active inductor circuitry may be configured to adjust a transconductance of at least one of the first and second transconductors or a capacitance value of the capacitance in response to the control signal.

The control circuitry may be configured to estimate the impedance of the piezoelectric transducer based on a voltage of known amplitude output to the piezoelectric transducer by the driver circuitry and current through the piezoelectric transducer detected by the current monitor circuitry.

The driver circuitry may be configured to output a chirp signal, and the active inductor circuitry may be configured to adjust a frequency characteristic thereof according to the chirp signal, such that the frequency characteristic of the active inductor circuitry tracks the changing frequency of the chirp signal.

The active inductor circuitry may be configured to receive the chirp signal or a signal indicative of the chirp signal from the driver circuitry.

The active inductor circuitry may comprise first and second transconductors and a capacitance, and the active inductor circuitry may be configured to adjust a transconductance of at least one of the first and second transconductors or a capacitance value of the capacitance according to the chirp signal.

According to a second aspect the invention provides an integrated circuit comprising driver circuitry configured to generate a drive signal for driving a piezoelectric transducer to cause the transducer to generate an output signal and active inductor circuitry configured to be coupled with the piezoelectric transducer.

The active inductor circuitry may be tuneable to adjust a frequency characteristic of the output signal.

The active inductor circuitry may comprise gyrator circuitry and a capacitance.

The gyrator circuitry may comprise first and second transconductors arranged in a back-to-back configuration.

The capacitance and/or a transconductance of at least one of the first and second transconductors may be adjustable.

According to a third aspect, the invention provides a system comprising a first piezoelectric transducer associated with first driver circuitry and first active inductor circuitry and a second piezoelectric transducer associated with second driver circuitry and second active inductor circuitry, wherein the first active inductor circuitry is tuneable so as to provide a first operational bandwidth for the first piezoelectric transducer and the second active inductor circuitry is tuneable so as to provide a second operational bandwidth, different from the first operational bandwidth, for the second piezoelectric transducer.

According to a fourth aspect, the invention provides circuitry for driving a piezoelectric transducer, the circuitry comprising driver circuitry configured to supply a drive signal to the piezoelectric transducer and gyrator circuitry configured to be coupled with the piezoelectric transducer, wherein the gyrator circuitry is tuneable to adjust an operational frequency characteristic of the piezoelectric transducer.

According to a fifth aspect, the invention provides an integrated circuit comprising the circuitry of the first aspect.

BRIEF DESCRIPTION OF THE DRAWINGS

Embodiments of the invention will now be described, strictly by way of example only, with reference to the accompanying drawings, of which:

FIG. 1 is a simplified schematic diagram illustrating circuitry for driving a piezoelectric transducer for use in a parking sensor system;

FIG. 2 is a simplified schematic diagram illustrating alternative circuitry for driving a piezoelectric transducer;

FIG. 3b illustrates a frequency response of the model of FIG. 3a;

FIG. 4a is a schematic diagram illustrating the addition of a series inductor to the BVD model shown in FIG. 3a;

FIG. 4b illustrates a frequency response of the modified model of FIG. 4a;

FIG. 5 is a schematic diagram illustrating an example of circuitry for driving a piezoelectric transducer, including driver circuitry and active inductor circuitry;

FIG. 10 is a schematic diagram illustrating a further example of circuitry for driving a piezoelectric transducer, including driver circuitry and active inductor circuitry.

DETAILED DESCRIPTION

In one alternative system, shown generally at 200 in FIG. 2, an inductance 210 is coupled in series between the driver circuitry 110 and the piezoelectric element 120. This has the effect of increasing the operational bandwidth of the piezoelectric element 120, thus enabling the transformer 130 of FIG. 1 to be removed, as lower frequency ultrasound signals, which inherently have longer range, can be used.

Figure 3B:
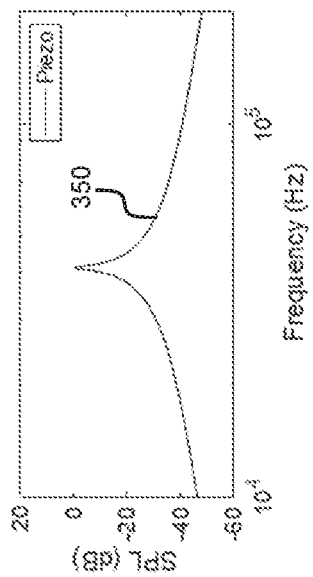
Figure 3A:
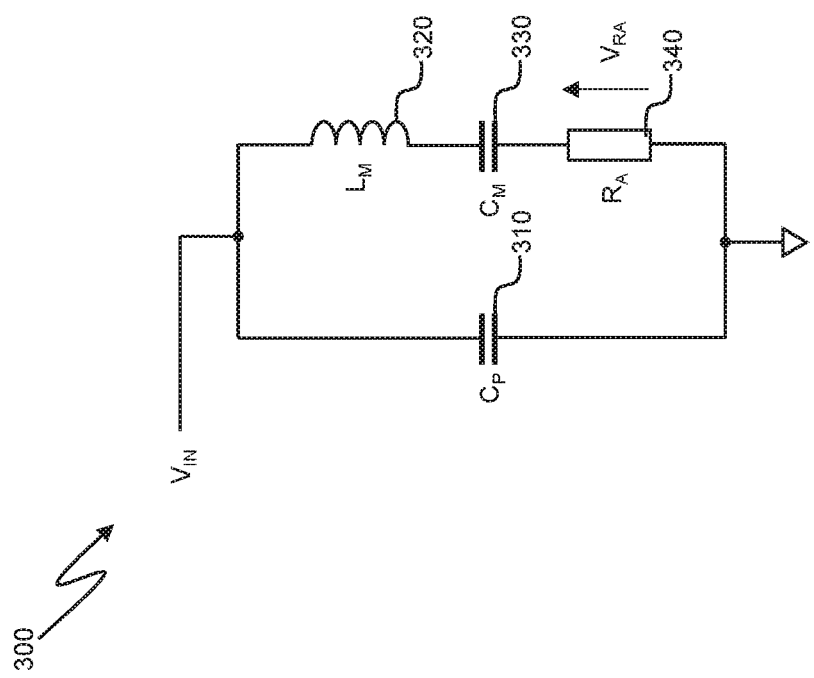
FIG. 3a is a schematic diagram illustrating a Butterworth Van Dyke (BVD) model of a piezoelectric transducer.

FIG. 3a is a schematic diagram illustrating a Butterworth Van Dyke (BVD) model circuit 300 of a piezoelectric element such as the piezoelectric element 120. As can be seen, in the circuit 300 the piezoelectric element is modelled as a filter comprising a first capacitance 310 of value $C_P$ in parallel with a series combination of an inductance 320 of value $L_M$, a second capacitance 330 of value $L_M$ and a resistance 340 of value $R_M$. In the circuit 300, a voltage $V_{RA}$ (representing acoustic power output by the piezoelectric element 120) develops across the resistance 340 in response to an applied input voltage $V_{IN}$. The transfer function from $V_{IN}$ to $V_{RA}$ in the model 300 is given by:

$$T = \frac{V_{RA}}{V_{IN}} = \frac{sC_M R_A}{1 + s^2 C_M L_M + sC_M R_A},$$

where s is the frequency operator $j\omega$.

As will be apparent from the equation above and the frequency response shown at 350 in FIG. 3b, the piezoelectric element 120 modelled by the circuit 300 is a strongly resonant system.

Figure 4B:
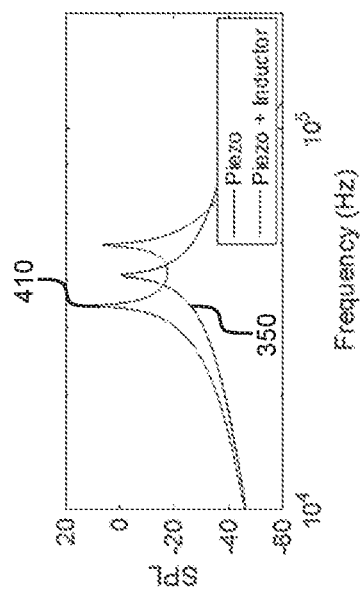
Figure 4A:
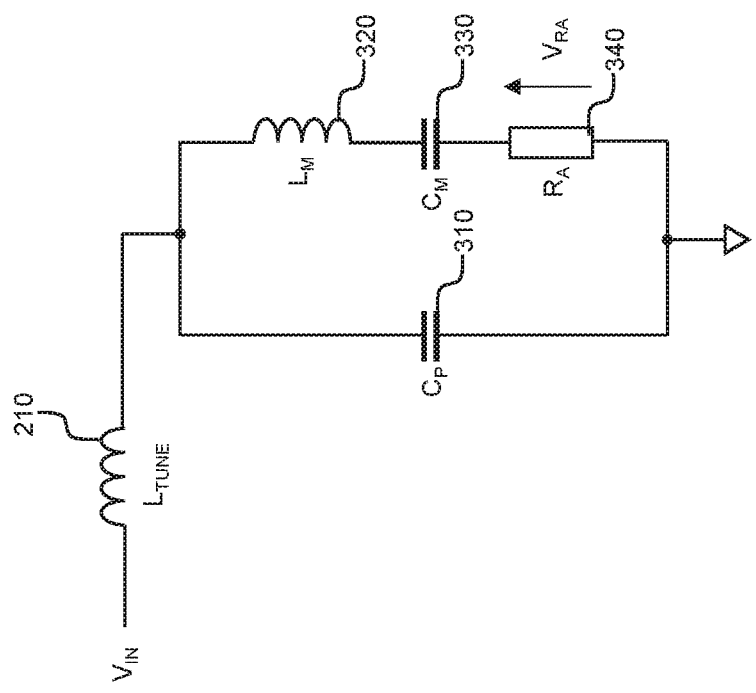

Modifying the circuit 300 by adding a series inductance 210 of value $L_{TUNE}$ to the circuit (as in the system 200 of FIG. 2) gives the model circuit illustrated at 400 in FIG. 4a. The transfer function of from $V_{IN}$ to $V_{RA}$ of the circuit 400 is given by:

$$T = \frac{V_{RA}}{V_{IN}} = \frac{s^3 C_M L_{TUNE} R_A (C_P + C_M(1 + sC_P(sL_M + R_A)))}{(1 + sC_M(sL_M + R_A))(1 + s^2 C_P L_{TUNE} + sC_M(L_M(s + s^3 C_P L_{TUNE}) + R_A + sL_{TUNE}(1 + sC_P R_A)))}$$

If the value of the series inductance 210 is selected to maximally split the poles in the transfer function in order to maximise the bandwidth of the circuit, by inspection the value $L_{TUNE}$ of the series inductance is given by:

$$L_{TUNE} \approx L_M \frac{C_M}{C_P}$$

The frequency response of the circuit 400 is shown at 410 in FIG. 4b (which also shows the frequency response 350 of the unmodified circuit 300 shown in FIG. 3). As will be apparent from the frequency response 410, the addition of the series inductance 410 has increased the bandwidth of the circuit 400, in comparison to that of the circuit 300. However, this increase in bandwidth requires a large inductor to implement the inductance 210. Such an inductor cannot be implemented as part of an integrated circuit, but must instead be provided off-chip.

FIG. 5 is a schematic illustration of an alternative approach according to an aspect of the present disclosure, which avoids the need for an off-chip inductor.

In the system shown generally at 500 in FIG. 5, driver circuitry 110 for providing a drive signal to a piezoelectric element 120 and active inductor circuitry 510 are provided on an integrated circuit 520. The driver circuitry 110 provides a drive signal to a first terminal of the piezoelectric element 120 (which is provided externally of the integrated circuit 520, i.e. off-chip), and a second terminal of the piezoelectric element is coupled to the active inductor circuitry 510. The active inductor circuitry 510 is configured to implement an on-chip active inductor, and thus in the system 500 illustrated in FIG. 5 there is no need for a separate off-chip inductor. The active inductor circuitry 510 may be implemented using gyrator circuitry and a capacitance, for example. The active inductor circuitry 510 may be tuneable so as to permit adjustment of a frequency characteristic of an output signal generated by the piezoelectric element 120 in response to the drive signal.

Figure 6:
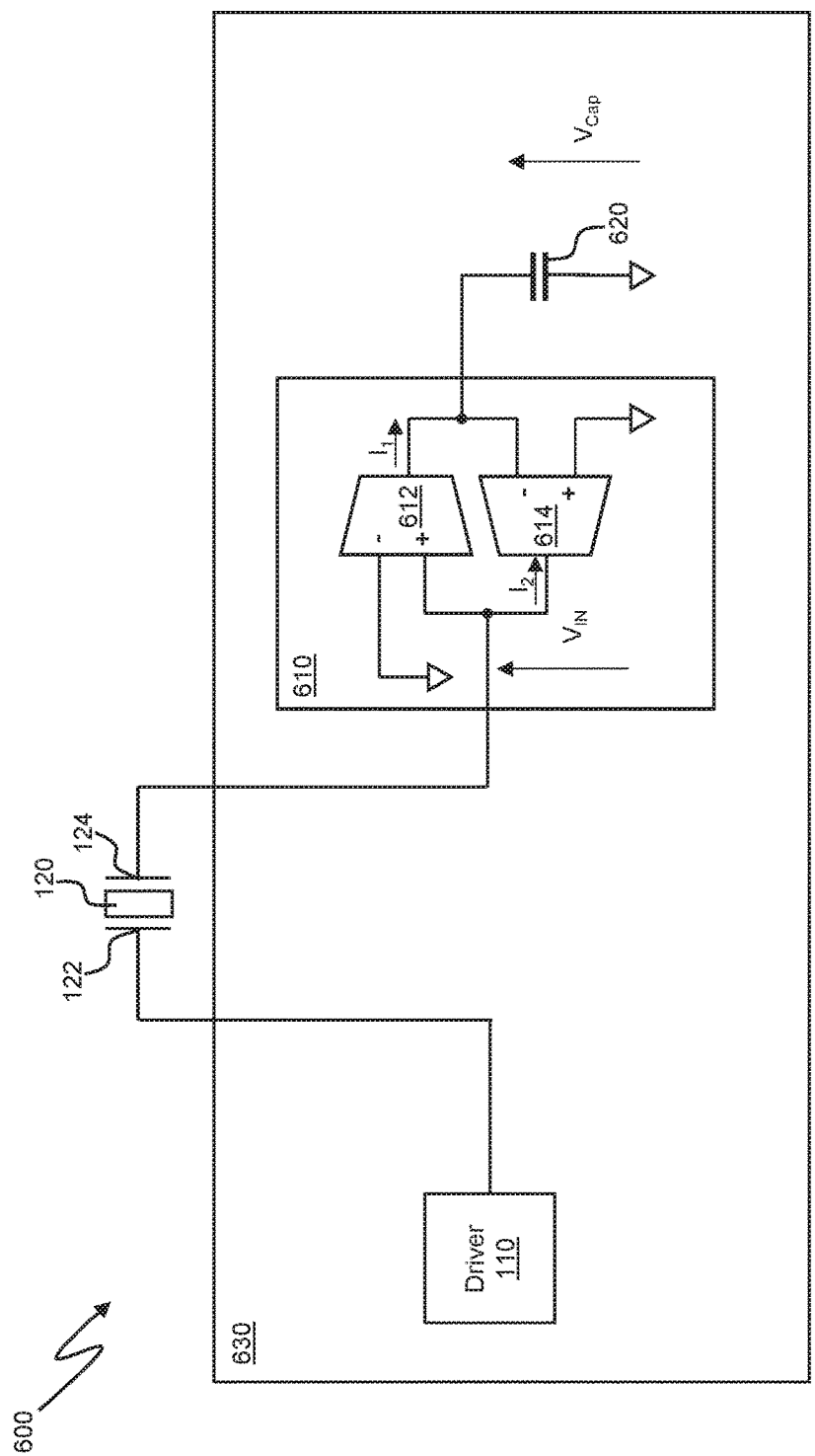
FIG. 6 is a schematic diagram of a system for driving a piezoelectric transducer including example gyrator circuitry.

FIG. 6 is a schematic representation of a system for driving a piezoelectric transducer. The system, shown generally at 600, includes driver circuitry 110 configured to provide a drive signal to a first terminal 122 of a piezoelectric element 120 of the piezoelectric transducer. The system 600 further includes gyrator circuitry 610 coupled to a second terminal 124 of the piezoelectric element 120 and a capacitor 620 of value $C_G$ coupled between the gyrator circuitry 610 and a reference voltage source, which in this example is a ground rail. The driver circuitry 110, gyrator circuitry 610 and capacitor 620 may be provided on an integrated circuit 630, whilst the piezoelectric element 120 is external to the integrated circuit 630 (i.e. is off-chip). The combination of the gyrator circuitry 610 and the capacitor 620 constitutes active inductor circuitry of the kind shown at 510 in FIG. 5.

The gyrator circuitry 610 includes first and second transconductors 612, 614 arranged in a back to back configuration. The transconductors 612, 614 may be implemented by operational transconductance amplifiers, for example. Each of the transconductors 612, 614 has a first and second input and an output, and is configured to generate an output current Iout based on 1) a difference between voltages V1, V2 at its first and second inputs and 2) a transconductance value Gm of the transconductor, i.e. $I_{out}=Gm\cdot(V1-V2)$.

In use of the system 600, a first input (labelled + in FIG. 6) of the first transconductor 612 is coupled to the second terminal 124 of the piezoelectric element 120 so as to receive an input voltage $V_{IN}$. A second input (labelled − in FIG. 6) of the first transconductor 612 is coupled to a reference voltage source, which in the illustrated example is the ground rail. The first transconductor 612 is thus configured to generate a first output current $I_1$ that is dependent upon the input voltage $V_{IN}$ and a transconductance value Gm of the first transconductor 612, i.e. $I_1=Gm\cdot V_{IN}$.

The capacitor 620 is coupled to an output of the first transconductor 612 so as to receive the first output current $I_1$. A voltage $V_{cap}$ develops across the capacitor 620 as a result of the first output current $I_1$, and this voltage $V_{cap}$ lags the first output current $I_1$ by 90 degrees. The voltage $V_{cap}$ thus also lags the input voltage $V_{IN}$.

A first input (labelled + in FIG. 6) of the second transconductor 614 is coupled to the reference voltage source, and a second input (labelled − in FIG. 6) of the second transconductor 614 is coupled to the output of the first transconductor 612, and thus to the capacitor 620. The second transconductor 614 is thus configured to generate a second output current $I_2$ that is dependent upon the voltage $V_{cap}$ that develops across the capacitor 620 and a transconductance value Gm (which in this example is equal to the transconductance value of the first transconductor 612) of the second transconductor 614, i.e. $I_2=-Gm\cdot V_{cap}$. As it is based on the voltage $V_{cap}$ that develops across the capacitor 620, the second output current $I_2$ lags the input voltage $V_{IN}$.

Figure 7:
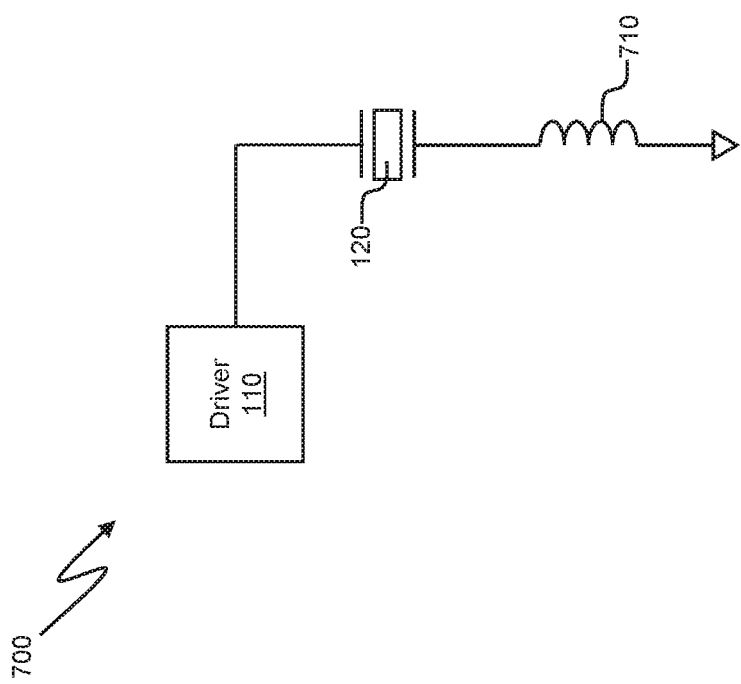
FIG. 7 is a schematic diagram illustrating electrical equivalent circuitry of the circuitry illustrated in FIG. 6.

Thus the combination of the gyrator circuitry 610 and the capacitor 620 acts as an inductor 710 of inductance $$=\frac{C_G}{Gm^2},$$

as illustrated in the equivalent circuit 700 of FIG. 7.

As will be apparent from the equation above, a desired equivalent inductance value L can be implemented by selecting appropriate values for the transconductances of the transconductors 612, 614 of the gyrator circuitry 610 and/or the capacitance of the capacitor 620. In this way frequency characteristics of the system 600 such as the operational frequency response and bandwidth can be set and (if the transconductance and capacitance values are adjustable) adjusted as required to achieve desired effects such as increased range and/or reduced susceptibility to interference.

Figure 8:
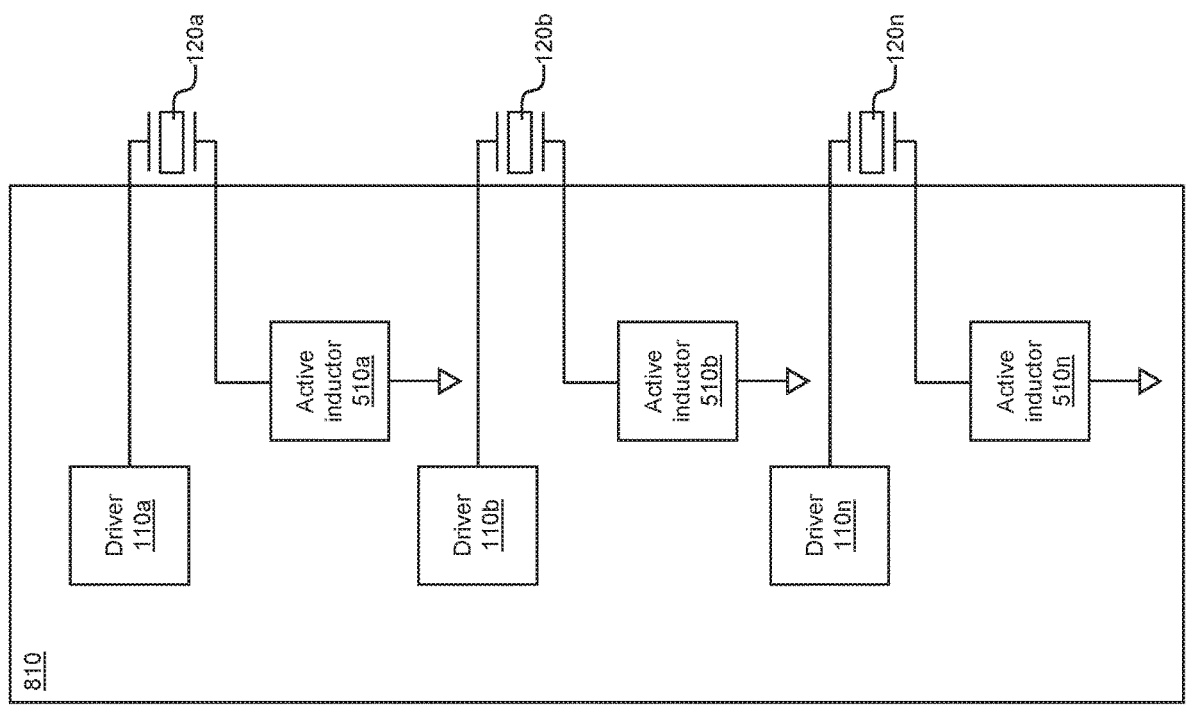
FIG. 8 is a schematic diagram illustrating a system including a plurality of piezoelectric elements, each of which is associated with circuitry of the kind illustrated in FIG. 5.

FIG. 8 is a schematic diagram illustrating a system 800 including a plurality of piezoelectric elements 120*a*-120*n*, each of which is associated with separate driver circuitry 110*a*-110*n* and separate active inductor circuitry 510*a*-510*n* of the kind described above with reference to FIG. 5. The active inductor circuitry 510*a*-510*n* of the system 800 may be based on the gyrator-capacitor arrangement described above with reference to FIG. 6.

The active inductor circuitry 510*a*-510*n* of the system 800 permits the operational frequency characteristics of each of the piezoelectric elements 120*a*-120*n* to be tuned differently, e.g. by setting or adjusting the transconductance values of transconductors and/or the capacitance value of a capacitor used in the active inductor circuitry 510*a*-510*n* associated with each piezoelectric element 120*a*-120*n*. For example, first active inductor circuitry 510*a* associated with a first piezoelectric element 120*a* can be tuned so as to provide a first operational bandwidth for the first piezoelectric element 120*a*, whilst second active inductor circuitry 510*b* associated with a second piezoelectric element 120*b* can be tuned so as to provide a second operational bandwidth, different from the first operational bandwidth, for the second piezoelectric element 120*b*. Similarly, nth active inductor circuitry 510*n* associated with an nth piezoelectric element 120*n* can be tuned so as to provide an nth operational bandwidth, different from the first and second operational bandwidths, for the nth piezoelectric element 120*bn*. In this way the risk of interference between the piezoelectric elements 120*a*-120*n* can be reduced.

Thus, in a system that has a plurality of co-located piezoelectric elements, each element can be statically tuned to a different operational bandwidth, so as to minimise co-existence problems such as interference between elements.

For example, in a system such as a parking sensor system that includes a plurality of piezoelectric transducers that are to operate simultaneously, the frequency response and operational bandwidth of each transducer can be tuned differently (e.g. during a calibration process performed during manufacture or installation of the system) to reduce the risk of interference between the piezoelectric transducers.

Additionally, the transconductance values of the transconductors 612, 614 and/or the capacitance value of the capacitor 620 may be dynamically adjustable. For example, the transconductance values of the transconductors 612, 614 may be adjustable by adjusting a bias voltage or current, and the capacitor 620 may be implemented using, for example, a switched capacitor network or other variable capacitance arrangement, thus allowing the capacitance value of the capacitor 620 to be adjusted. This allows the frequency parameters of the system 600 to be adjusted dynamically in use.

For example, where the system 600 is used to drive a piezoelectric element 120 in a system such as a parking sensor system, the operational bandwidth of the piezoelectric element 120 may be optimised by dynamically adjusting the frequency response and/or bandwidth of the system 600 to correspond to a driving signal generated by the driver circuitry 110. Thus, a chirp signal (i.e. a signal whose frequency increases or decreases over time) can be generated by the driver circuitry 110 to drive the piezoelectric element 120, and the frequency response and/or bandwidth of the system 600 may be adjusted accordingly.

Figure 9:
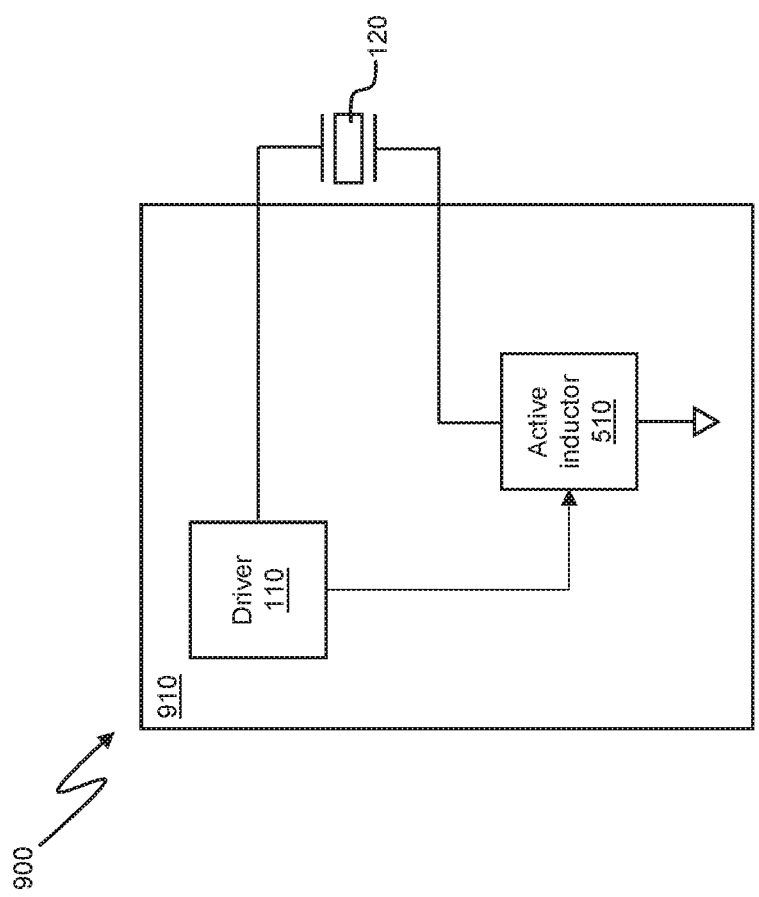
FIG. 9 is a schematic diagram illustrating an example of the circuitry of FIG. 5 in which the driver circuitry provides an indication of a frequency of a drive signal to the active inductor circuitry.

FIG. 9 is a schematic illustration of such a system. As shown, the system 900 includes driver circuitry 110 and active inductor circuitry 510, configured as in the system 500 of FIG. 5. The active inductor circuitry 510 may be implemented using the arrangement of gyrator circuitry 610 and a capacitor 620 shown in FIG. 6 and described above. The driver circuitry 110 and active inductor circuitry 510 may be provided on an integrated circuit 910.

In the system 900 of FIG. 9, the driver circuitry 110 is configured to generate a chirp signal to drive the piezoelectric element 120. The driver circuitry 110 in this example is coupled to the active inductor circuitry 510 so as to provide the chirp signal (or a signal indicative of the chirp signal) to the active inductor circuitry 510. The active inductor circuitry 510 is configured to adjust a frequency characteristic (e.g. a bandwidth or frequency response) thereof according to the signal received from the driver circuitry 110, such that the frequency characteristic of the active inductor circuitry 510 tracks the changing frequency of the chirp signal. In this way the frequency characteristic of the active inductor can be dynamically adjusted to correspond to the instantaneous frequency of the chirp signal, thus allowing a wider bandwidth chirp signal to be generated and transmitted by the piezoelectric element than when the frequency characteristic of the active inductor 510 is static. This can improve the range and selectivity of the system.

As will be appreciated from the discussion above, where the active inductor circuitry 510 is implemented using transconductors and a capacitor as in the example illustrated in FIG. 6, the frequency characteristic of the active inductor circuitry 510 may be adjusted by adjusting the transconductance values of the transconductors 612, 614 and/or by adjusting the capacitance value of the capacitor 620 according to the chirp signal in order to track the frequency of the chirp signal.

Additionally, the active inductor circuitry 510 can be tuned to compensate for component variations, e.g. a deviation from rated or nominal parameter values for the piezoelectric element 120.

FIG. 10 is a schematic diagram illustrating circuitry for detecting and compensating for a parameter value of a piezoelectric transducer 120. As can be seen, the system 100 include driver circuitry 110 and active inductor circuitry 510 of the kind described above. The system further includes current monitor circuitry 1010, coupled in series between the piezoelectric transducer 120 and the active inductor circuitry. The driver circuitry 110, active inductor circuitry 510 and current monitor circuitry 1010 may be provided in an integrated circuit 1020.

The current monitor circuitry 1010 may comprise, for example, a resistance of known value, voltage detector circuitry coupled to the resistance so as to detect a voltage across the resistance, and control circuitry operative to control one or more parameters of the active inductor circuitry 510 (e.g. a transconductance value and/or a capacitance value) based on the detected voltage.

In operation of the system 1000, the driver circuitry 110 outputs a voltage of known amplitude to the piezoelectric element 120. The current monitor circuitry 1010 determines or infers a current through the piezoelectric element 120 and, based on the determined current and the known voltage output by the driver circuitry 110, estimates an impedance of the piezoelectric element 120. If this estimated impedance does not correspond to a rated or nominal impedance value for the piezoelectric element 120, the control circuitry of the current monitor circuitry 1010 can output a control signal Ctrl to the active inductor circuitry 510 to adjust a parameter such as a transconductance and/or a capacitance of the active inductor circuitry 510 so as to adjust an operational frequency characteristic such as the operational bandwidth and/or frequency response of the piezoelectric element 120 to correspond to an operational bandwidth and/or frequency response of the piezoelectric element 120 that would be expected if the actual impedance of the piezoelectric element 120 were the same as its rated or nominal impedance.

Thus the active inductor circuitry 510 can be tuned to compensate for variations in the parameters of the piezoelectric element 120 from rated or nominal parameter values.

The frequency characteristics of the active inductor circuitry 510 can then be dynamically adjusted as discussed above to track the frequency of a chirp signal output by the driver circuitry 110 in operation of the system 1000.

As will be appreciated, either or both of static tuning of the active inductor circuitry 510 to compensate for the effects of variations in the piezoelectric element 120, as described above with reference to FIG. 10, and dynamic tuning of the active inductor circuitry 510 to track the frequency of a chirp signal output by the driver circuitry 110, as described above with reference to FIG. 10, can be employed in the multi-element system 800 described above with reference to FIG. 8.

As will be apparent from the foregoing discussion, the circuitry of the present disclosure provides driver circuitry for driving a piezoelectric transducer obviates the need for a transformer or an off-chip inductor, as the operational frequency characteristics such as the frequency response and bandwidth of a piezoelectric transducer can be optimised to suit the requirements of a particular application by adjusting one or more parameters of the active inductor circuitry. Thus, parameters of the active inductor circuitry can be adjusted to compensate for variations in the electrical characteristics of individual piezoelectric elements (e.g. deviations from rated or nominal parameter values such as impedance). Further, parameters of the active inductor circuitry can be adjusted dynamically during use in order to tune an operational frequency characteristic such as the operational bandwidth of a piezoelectric element to a driving signal such as a chirp signal. Still further, in a system comprising a plurality of co-located piezoelectric elements, the operational frequency characteristics of the elements can be individually tuned to mitigate co-location issues such as interference between piezoelectric elements.

Embodiments may be implemented as an integrated circuit which in some examples could be a codec or audio DSP or similar. Embodiments may be incorporated in an electronic device, which may for example be a portable device and/or a device operable with battery power. The device could be a communication device such as a mobile telephone or smartphone or similar. The device could be a computing device such as a notebook, laptop or tablet computing device. The device could be a wearable device such as a smartwatch. The device could be a device with voice control or activation functionality such as a smart speaker. In some instances the device could be an accessory device such as a headset, headphones, earphones, earbuds or the like to be used with some other product.

The skilled person will recognise that some aspects of the above-described apparatus and methods, for example the discovery and configuration methods may be embodied as processor control code, for example on a non-volatile carrier medium such as a disk, CD- or DVD-ROM, programmed memory such as read only memory (Firmware), or on a data carrier such as an optical or electrical signal carrier. For many applications, embodiments will be implemented on a DSP (Digital Signal Processor), ASIC (Application Specific Integrated Circuit) or FPGA (Field Programmable Gate Array). Thus the code may comprise conventional program code or microcode or, for example code for setting up or controlling an ASIC or FPGA. The code may also comprise code for dynamically configuring re-configurable apparatus such as re-programmable logic gate arrays. Similarly the code may comprise code for a hardware description language such as Verilog™ or VHDL (Very high speed integrated circuit Hardware Description Language). As the skilled person will appreciate, the code may be distributed between a plurality of coupled components in communication with one another. Where appropriate, the embodiments may also be implemented using code running on a field-(re) programmable analogue array or similar device in order to configure analogue hardware.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

The invention claimed is:

1. A circuitry for driving a piezoelectric transducer, the circuitry comprising:
a driver circuitry configured to supply a drive signal to a first terminal of the piezoelectric transducer to cause the piezoelectric transducer to generate an output signal; and
an active inductor circuitry configured to be coupled to a second terminal of the piezoelectric transducer, such that in use of the circuitry the active inductor circuitry is coupled in series with the piezoelectric transducer, wherein the active inductor circuitry is tuneable to adjust a frequency characteristic of the output signal.

2. The circuitry according to claim 1, wherein the active inductor circuitry comprises:
gyrator circuitry; and
a capacitance.

3. The circuitry according to claim 2, wherein the capacitance is adjustable.

4. The circuitry according to claim 2, wherein the gyrator circuitry comprises first and second transconductors arranged in a back-to-back configuration.

5. The circuitry according to claim 4, wherein a transconductance of at least one of the first and second transconductors is adjustable.

6. The circuitry according to claim 5 wherein the first and second transconductors comprise operational transconductance amplifiers, each having a variable bias current or a variable bias voltage.

7. The circuitry according to claim 1 further comprising current monitor circuitry configured to be coupled to the piezoelectric transducer, the current monitor circuitry comprising control circuitry configured to:

estimate an impedance of the piezoelectric transducer; and output a control signal to the active inductor circuitry to cause the active inductor circuitry to adjust a parameter thereof so as to adjust an operational frequency characteristic of the piezoelectric transducer.

8. The circuitry according to claim 7 wherein the active inductor circuitry comprises first and second transconductors and a capacitance, and wherein the active inductor circuitry is configured to adjust a transconductance of at least one of the first and second transconductors or a capacitance value of the capacitance in response to the control signal.

9. The circuitry according to claim 7, wherein the control circuitry is configured to estimate the impedance of the piezoelectric transducer based on a voltage of known amplitude output to the piezoelectric transducer by the driver circuitry and current through the piezoelectric transducer detected by the current monitor circuitry.

10. The circuitry according to claim 1 wherein the driver circuitry is configured to output a chirp signal, and the active inductor circuitry is configured to adjust a frequency characteristic thereof according to the chirp signal, such that the frequency characteristic of the active inductor circuitry tracks a changing frequency of the chirp signal.

11. The circuitry according to claim 10 wherein the active inductor circuitry is configured to receive the chirp signal or a signal indicative of the chirp signal from the driver circuitry.

12. The circuitry according to claim 10 wherein the active inductor circuitry comprises first and second transconductors and a capacitance, and wherein the active inductor circuitry is configured to adjust a transconductance of at least one of the first and second transconductors or a capacitance value of the capacitance according to the chirp signal.

13. An integrated circuit comprising the circuitry of claim 1.

14. An integrated circuit comprising:
a driver circuitry configured to generate a drive signal for driving a first terminal of a piezoelectric transducer to cause the piezoelectric transducer to generate an output signal; and an active inductor circuitry configured to be coupled to a second terminal of the piezoelectric transducer, such that in use of the integrated circuit the active inductor circuitry is coupled in series with the piezoelectric transducer.

15. The integrated circuit according to claim 14, wherein the active inductor circuitry is tuneable to adjust a frequency characteristic of the output signal.

16. The integrated circuit according to claim 14, wherein the active inductor circuitry comprises gyrator circuitry and a capacitance.

17. The integrated circuit according to claim 16, wherein the gyrator circuitry comprises first and second transconductors arranged in a back-to-back configuration.

18. The integrated circuit according to claim 17, wherein the capacitance and/or a transconductance of at least one of the first and second transconductors is adjustable.

19. A system comprising:
a first piezoelectric transducer having a first terminal coupled to first driver circuitry and a second terminal coupled to first active inductor circuitry; and
a second piezoelectric transducer having a first terminal coupled to second driver circuitry and a second terminal coupled to second active inductor circuitry,
wherein the first active inductor circuitry is tuneable so as to provide a first operational bandwidth for the first piezoelectric transducer and the second active inductor circuitry is tuneable so as to provide a second operational bandwidth, different from the first operational bandwidth, for the second piezoelectric transducer.

20. A circuitry for driving a piezoelectric transducer, the circuitry comprising:
a driver circuitry configured to supply a drive signal to a first terminal of the piezoelectric transducer; and
a gyrator circuitry configured to be coupled to a second terminal of the piezoelectric transducer such that in use of the circuitry the gyrator circuitry is coupled in series with the piezoelectric transducer, wherein the gyrator circuitry is tuneable to adjust an operational frequency characteristic of the piezoelectric transducer.

* * * * *